(12) United States Patent
Hayakawa et al.

(10) Patent No.: US 7,097,488 B2
(45) Date of Patent: Aug. 29, 2006

(54) SOCKET FOR ELECTRICAL PARTS

(75) Inventors: Kenji Hayakawa, Saitama (JP);
Hiroyuki Hiraiwa, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/986,021

(22) Filed: Nov. 12, 2004

(65) Prior Publication Data
US 2005/0181656 A1 Aug. 18, 2005

(30) Foreign Application Priority Data
Nov. 17, 2003 (JP) .............................. 2003-386923

(51) Int. Cl.
*H01R 13/62* (2006.01)
(52) U.S. Cl. ...................................... 439/331; 439/330
(58) Field of Classification Search ........ 439/330–331, 439/70–73
See application file for complete search history.

(56) References Cited

U.S. PATENT DOCUMENTS 4,745,456 A * 5/1988 Clemens ..................... 257/717

FOREIGN PATENT DOCUMENTS

JP 2000-113954 4/2000

* cited by examiner

*Primary Examiner*—Javaid H. Nasri
(74) *Attorney, Agent, or Firm*—Staas & Halsey LLP

(57) ABSTRACT

A socket for an electrical part of the present invention has a socket body provided with an accommodation portion in which an IC package is accommodated, an open/close mechanism having a heat sink for performing radiation of heat of the IC package accommodated on the socket body, and a latch member for pressing the IC package accommodated on the socket body, in which opening and closing timings of the open/close mechanism and the latch member are set such that the latch member is first closed and the open/close mechanism is thereafter closed.

13 Claims, 20 Drawing Sheets

SOCKET FOR ELECTRICAL PARTS

BACKGROUND OF THE INVENTION

1. Field of the Invention

The present invention relates to a socket for an electrical part holding an electrical part such as semiconductor device (called hereinlater "IC package") or like and provided with an open/close mechanism abutting against an upper surface of such electrical part so as to widely press the same.

2. Prior Art of the Invention

One example of a socket of the kind mentioned above is disclosed in Japanese Laid-Open Patent Publication No. 2000-113954, in which a socket includes a socket body to which an IC mount space is formed and a contact to be electrically connected to an IC package mounted to the IC mount space.

The socket body is also provided with a pressing member to be rotatable, and a heat sink is provided for the pressing member for performing heat radiation through contacting to the IC package. After the IC package is pressed by the pressing member, this pressing member is pressed by a latch so as to indirectly press the IC package.

However, in the structure disclosed in this publication, after the pressing member provided with the heat sink is closed, this pressing member is pressed by the latch, so that it is required for the heat sink to have a size capable of being positioned inside arrangement of a plurality of latches so as not to be interfered with the latches. According to such requirement, it is difficult to make large the size of the heat sink, resulting in less heat radiation function of the heat sink.

SUMMARY OF THE INVENTION

An object of the present invention is accordingly to provide a socket for an electrical part capable of being provided with a large-sized heat sink, hence improving heat radiation performance of the electrical part and widely pressing an upper surface of the electrical part.

In order to achieve the above object, the present invention provides, in one aspect, a socket for an electrical part comprising a socket body provided with an accommodation portion in which an electrical part is accommodated, an open/close mechanism provided with a heat sink for performing radiation of heat of the electrical part accommodated on the socket body, and a latch member pressing the electrical part accommodated on the socket body, wherein opening and closing timings of the open/close mechanism and the latch member are set such that the latch member is first closed and the open/close mechanism is closed thereafter.

The present invention also provides, in another aspect, a socket for an electrical part comprising a socket body provided with an accommodation portion in which an electrical part is accommodated, a latch member pressing a peripheral edge portion of the electrical part accommodated on the socket body, and an open/close mechanism pressing a portion of the electrical part inside a pressing portion of the latch member, wherein opening and closing timings of the open/close mechanism and the latch member are set such that the latch member is first closed and the open/close mechanism is closed thereafter.

The present invention has further characteristic feature in which the accommodation portion of the socket body has a rectangular structure and the open/close mechanism is disposed at one side portion of the rectangular structure of the accommodation portion and three latch members are disposed at three side portions of the rectangular structure thereof.

The present invention has a further characteristic feature in which the open/close mechanism and the latch member are disposed to be rotatable around rotational shafts and urged by urging means in opening directions thereof, and the socket body is provided with an operation member to be vertically movable, the operation member being formed with an open/close mechanism pressing member for pressing the open/close mechanism and a latch pressing member for pressing the latch member, in which when the operation member is moved upward, the open/close mechanism and the latch member are pressed respectively by the open/close mechanism pressing member and the latch pressing member to be thereby rotated in closing directions thereof.

The present invention has a further characteristic feature in which the latch member is rotated in a closing direction thereof, the electrical part is pressed thereby and, thereafter, when the latch member is moved in parallel in downward direction, the electrical part is pushed.

According to the one aspect of the present invention, since the opening and closing timings of the open/close mechanism and the latch member are set such that the latch member is first closed and the open/close mechanism is then closed, there is less possibility, for the open/close mechanism and the latch member, of erroneously carrying out their opening and closing operations, thereby surely performing the opening/closing operation thereof.

In addition, since the timings are set such that the latch member is first closed and the open/close mechanism is then closed, it is possible for the heat sink provided for the open/close mechanism to have a size capable of covering the latch member, and hence, the heat sink can be constructed in a large size, thus improving the heat radiation function thereof.

Incidentally, in the conventional structure in which the latch member is closed after the closing of the open/close mechanism, it is difficult to have a structure capable of covering the latch member with the heat sink. Accordingly, it is impossible for the heat sink to have a large size such as in the present invention.

According to the other aspect of the present invention mentioned above, after pressing the peripheral edge portion of the electrical part by the latch member, the open/close mechanism can widely and uniformly press a portion of the electrical part inside the pressing portion of the latch member, so that, even in a case of extremely thin electrical part accommodated in the accommodation portion of the socket body, it is not warped, when pressed against the contact pin, by the reaction force from the contact pin, and the extremely stable pressing can be hence ensured.

According to the further characteristic feature of the present invention, the open/close mechanism is disposed at one side portion of a rectangular structure of the accommodation portion of the socket body and three latch members are disposed at three side portions of the rectangular structure, so that the heat sink can be formed in an integral structure, not with divided ones, and hence, an area of the contact projection contacting the electrical part can be made larger, thus improving the heat radiation function of the heat sink. That is, for example, if the heat sink is divided into two parts at its central portion, a gap is inevitably caused at its central portion when closed, which will provide an adverse heat radiation function. Moreover, since the contacting area of the contact projection can be made larger, the heat sink can be widely and uniformly contacted to the upper surface of the electrical part, establishing a stable contacting state.

According to the further characteristic feature of the present invention mentioned above, the open/close mechanism and the latch member are disposed to be rotatable around the rotational shafts and urged by the urging means in opening directions thereof, and the socket body is provided with an operation member to be vertically movable, the operation member being formed with an open/close mechanism pressing member for pressing the open/close mechanism and a latch pressing member for pressing the latch member, in which when the operation member is moved upward, the open/close mechanism and the latch member are pressed respectively by the open/close mechanism pressing member and the latch pressing member to be thereby rotated in closing directions thereof. Therefore, the open/close mechanism and the latch member can be opened and closed in the timings shifted from each other without being provided with any link mechanism.

According to the further characteristic feature of the present invention mentioned above, when the latch member is rotated in its closing direction, the electrical part is pressed and, thereafter, when the latch member is moved in parallel in downward direction, the electrical part is pushed. Therefore, it is possible to locate the rotational shaft of the latch member to a portion in the vicinity of the center of the socket, thus making compact the IC socket. That is, the latch member can be retired from the IC package insertion/take-out area by the outward rotating opening motion and can be moved in parallel in downward direction, thus ensuring the pushing amount or distance of the IC package 12. On the contrary, in a case when the IC package is retired from the IC package insertion/take-out area by entirely rotating the latch member to thereby ensure the IC package pushing amount, it is necessary to separate the rotational shaft from the IC package as much as possible (that is, to locate at a position on the outside of the IC socket), which may result in an enlargement of the IC package in its structure.

DETAILED DESCRIPTION OF THE PREFERRED EMBODIMENT

Figure 1:
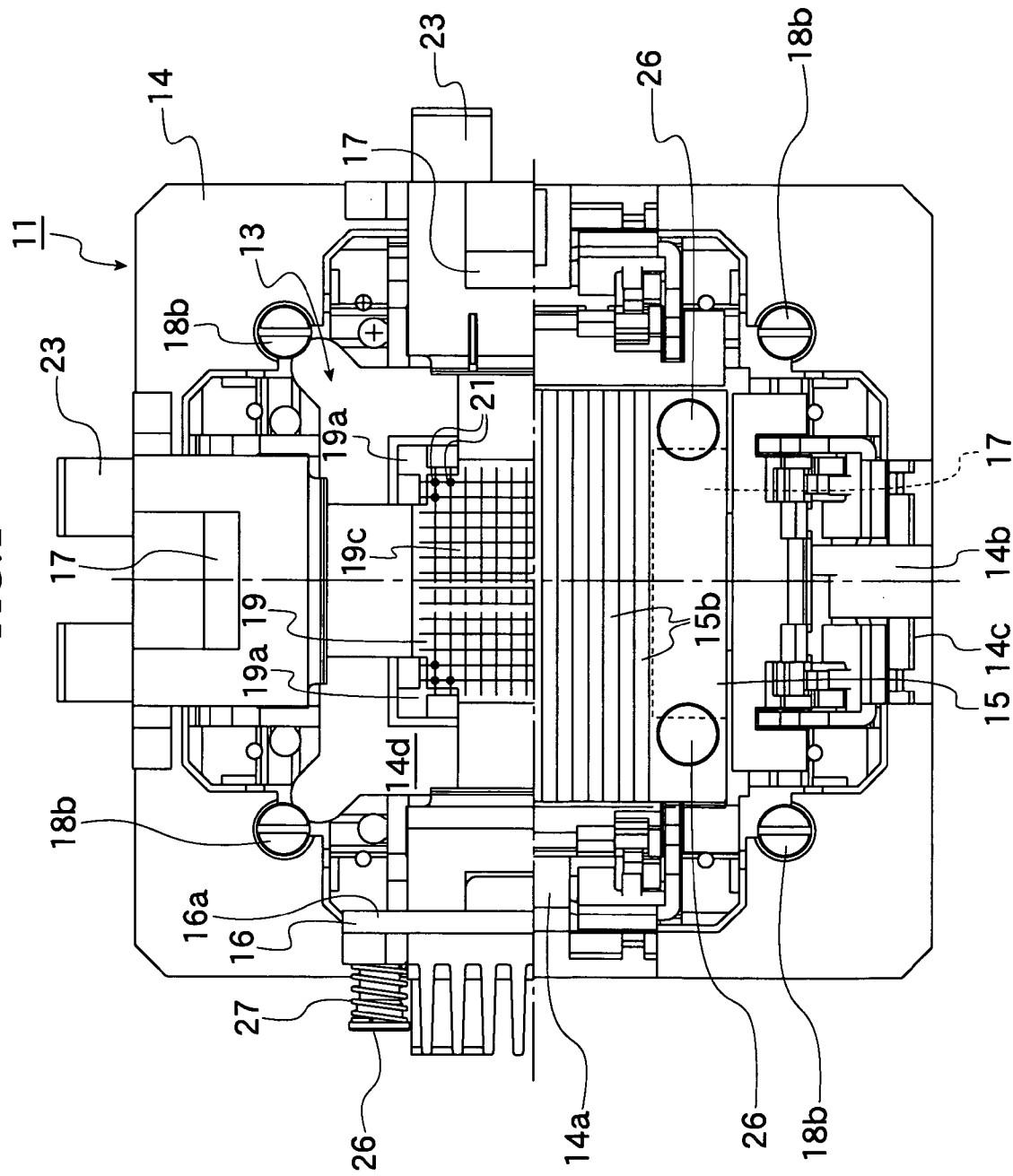
FIG. 1 is a plan view of an IC socket according to one embodiment of the present invention.

An embodiment of the present invention will be described hereunder.

FIGS. 1 to 20 represents one preferred embodiment of the present invention.

In a structure of the present invention, a reference numeral 11 denotes an IC socket as "socket for electrical parts", and the IC socket 11 is a member for establishing an electrical connection between a terminal 12b of an IC package 12, as the electrical part, and a circuit board, not shown, of a measuring device such as tester for carrying out a performance test of the IC package 12.

Figure 19:
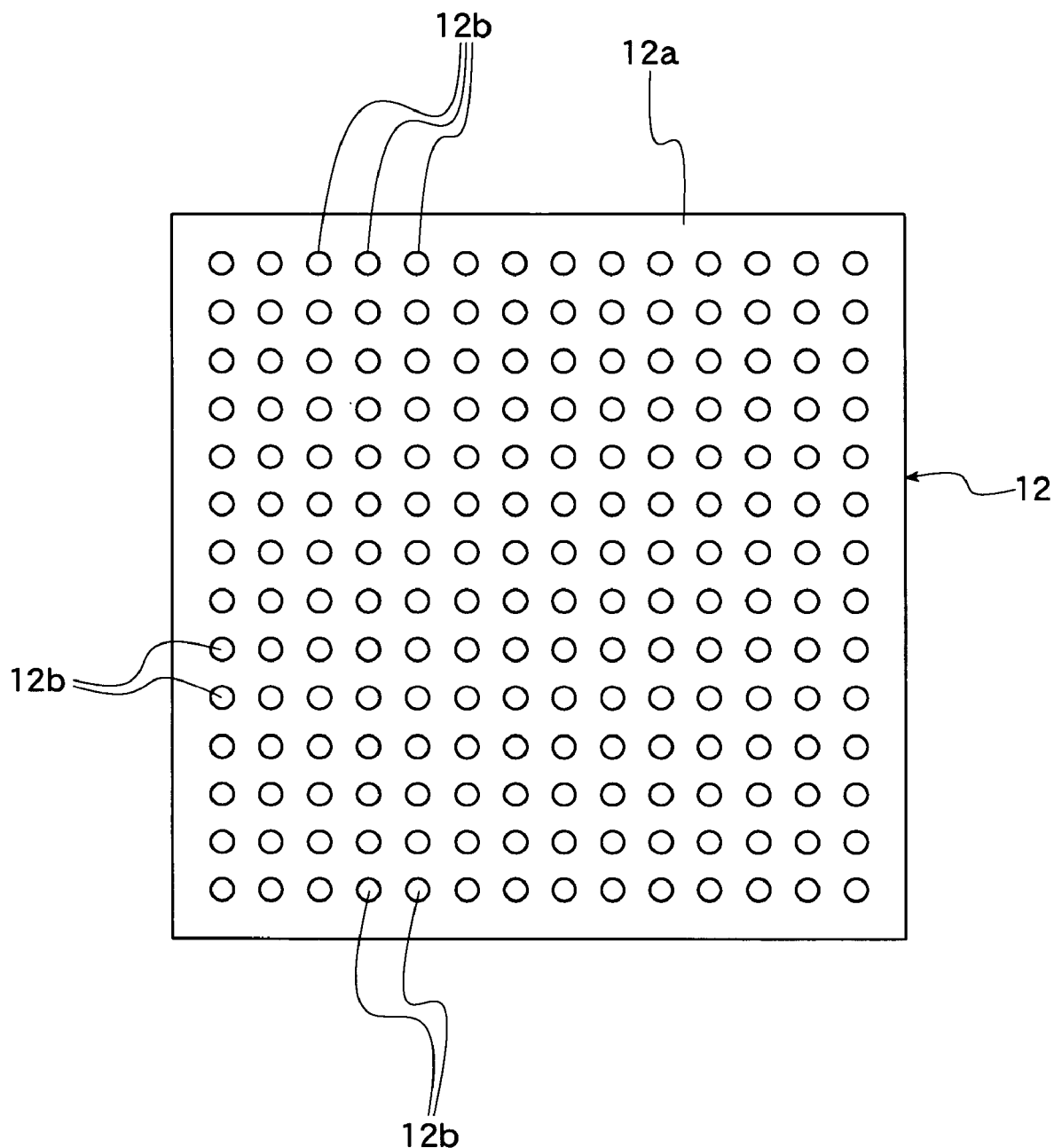
FIG. 19 is a bottom view of the IC package according to the present embodiment.
Figure 20:
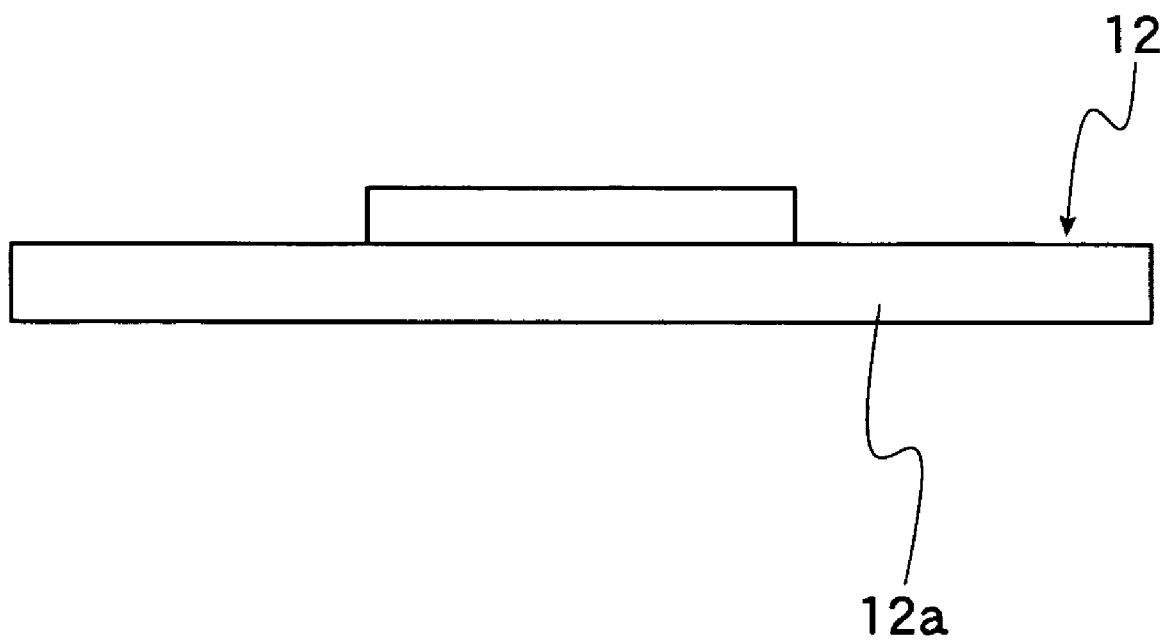
FIG. 20 is a front view of the IC package of the embodiment.

The IC package 12 has, as shown in FIGS. 19 and 20, for example, substantially square package body 12a having a bottom surface on which a number of terminals 12b are formed.

The IC socket 11 has a socket body 13 which is mounted on a circuit board and to which the IC package 12 is mounted. The socket body 13 is also provided with an operation member 14 to be vertically movable. When the operation member 14 is moved vertically, an open/close mechanism 16 provided with a heat sink 15 and a latch member 17 are moved so as to be opened or closed. In the present embodiment, one open/close mechanism 1 and three latch members 17 are arranged.

Figure 13:
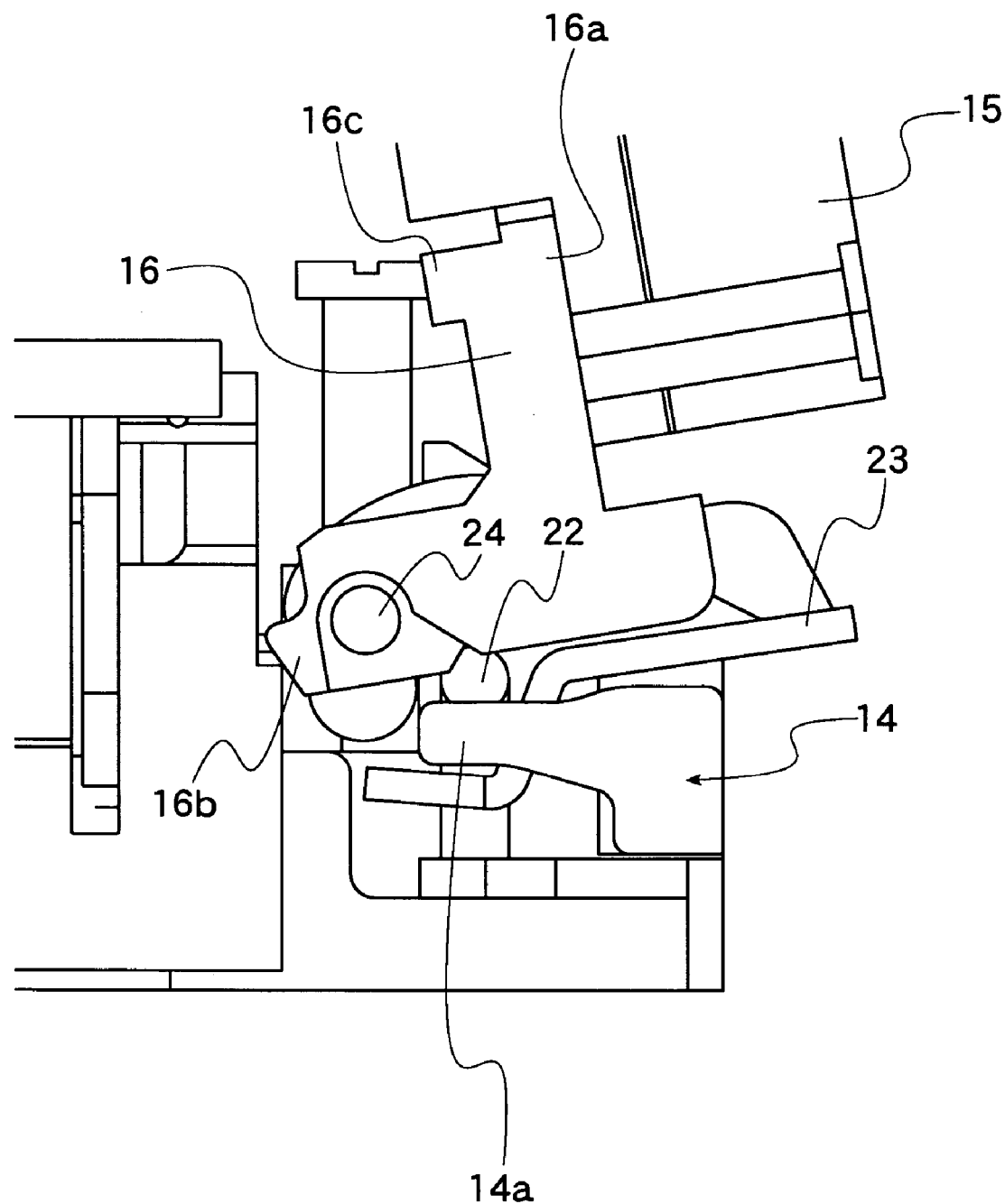
FIG. 13 is a view showing a state that the open/close mechanism of the embodiment is opened.

In more detail, as shown in FIG. 13, the socket body 13 further includes a base member 18 to which a floating plate 19, which is vertically movable, is mounted in a state urged upward by a spring 20. A plurality of contact pins 21 is arranged to the base member 18 and the floating plate 19 so as to extend vertically along them with a narrow pitch between adjacent ones.

The floating plate 19 is, as shown in FIG. 1, has a square structure having four corners at which guide members 19a are provided so as to extend upward for guiding respective corner portions of the IC package 12. The floating plate 19 is also formed with a plurality of through holes 19b through which the contact pins 21 are inserted, respectively.

Figure 2:
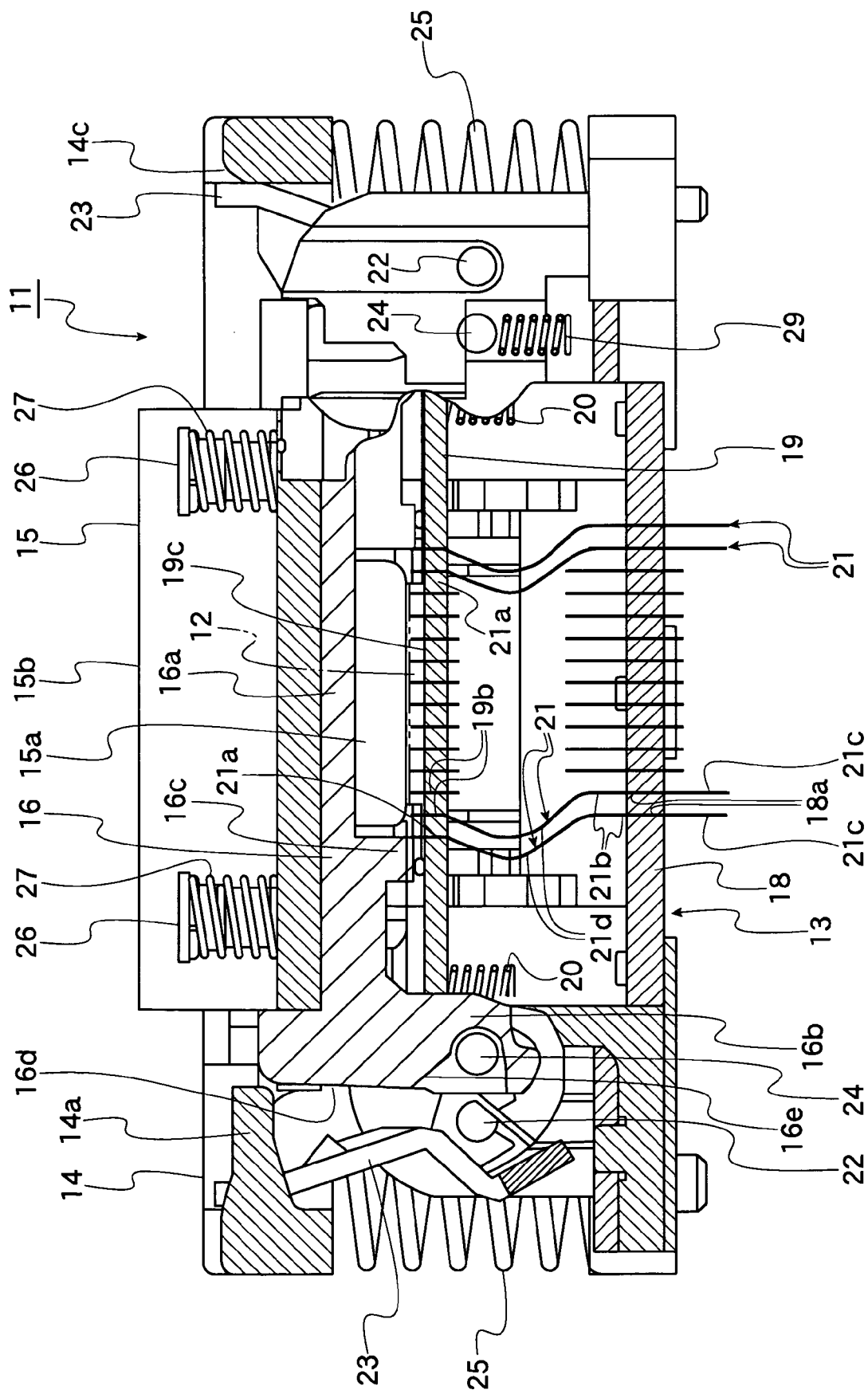
FIG. 2 is a sectional view of the IC socket of the embodiment of FIG. 1.

As shown in FIG. 2, each of the contact pins 21 has an upper portion 21a inserting into the through hole 19b and a lower portion 21b inserted into a through hole 18a formed to the base member 18 so that a lead portion 21c of the contact pin 21 projects downward over the through hole 18a. The contact pin 21 has a curved intermediate portion 21d to be elastically deformable.

The contact pin 21 is formed from a electrically conductive substance, the lead portion 21c thereof is electrically connected to the circuit board, and the upper portion 21a thereof abuts against the terminal 12b of the IC package 12 to thereby establish the electrical connection.

Figure 4:
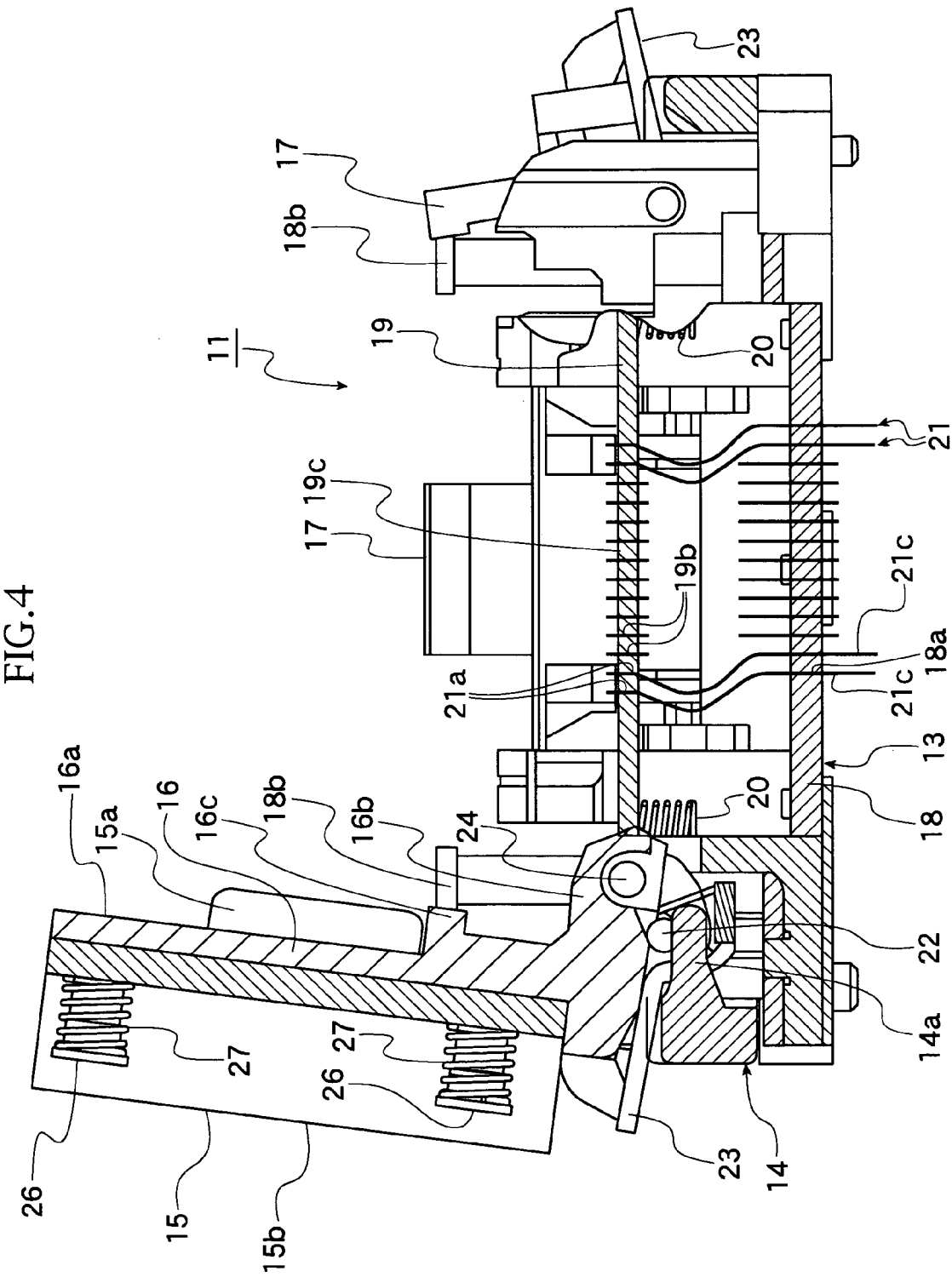
FIG. 4 is a sectional view showing a state that an open/close mechanism according to the present embodiment is opened.

The operation member 14 has a rectangular frame structure and has, as shown in FIG. 4, an opening 14d of a size allowing the IC package 12 to be inserted therethrough. The IC package 12 inserted through this opening 14d, is mounted and accommodated on the floating plate 19 of the socket body 13.

Figure 3:
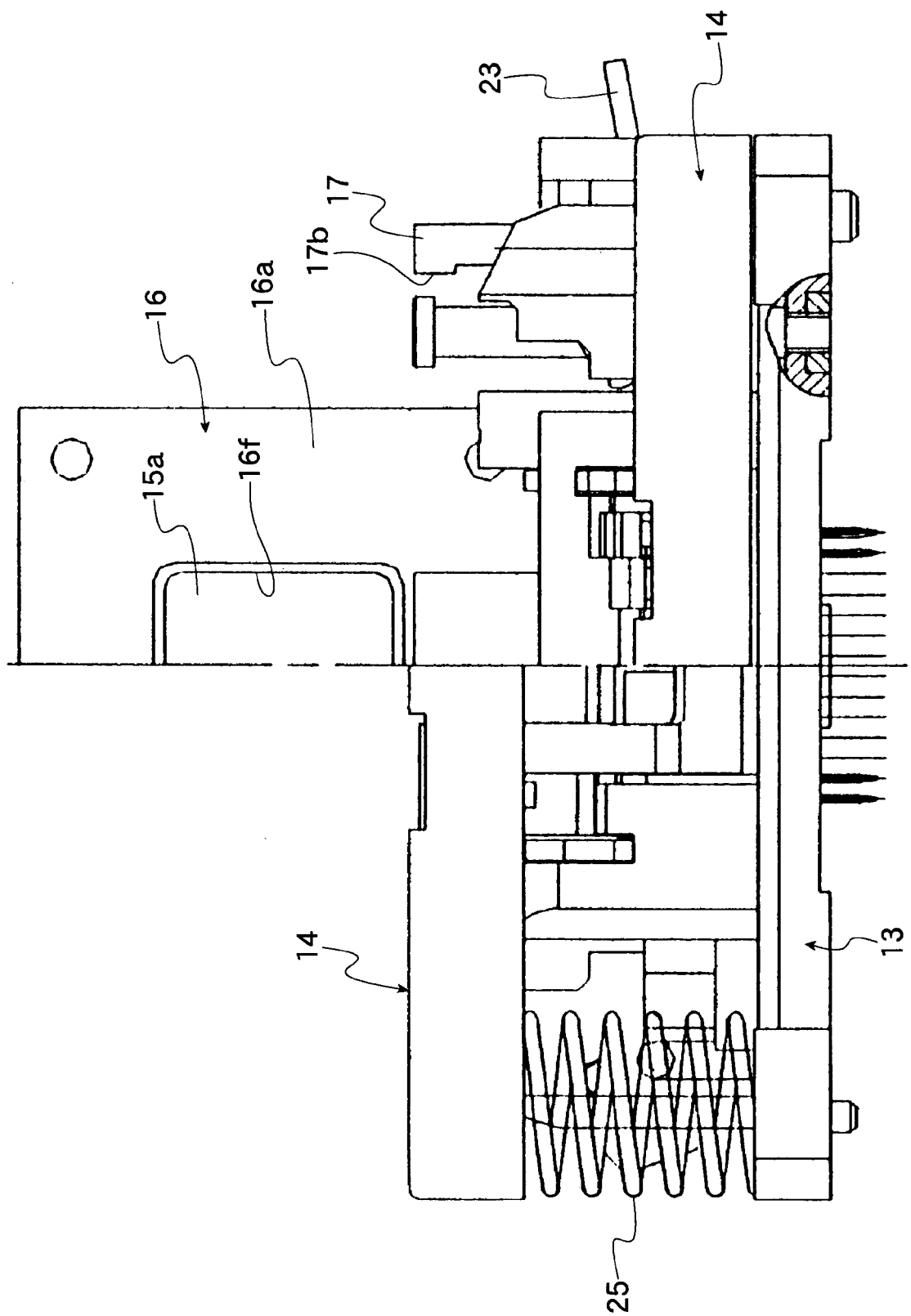
FIG. 3 is a right side view of the embodiment of FIG. 1.
Figure 5:
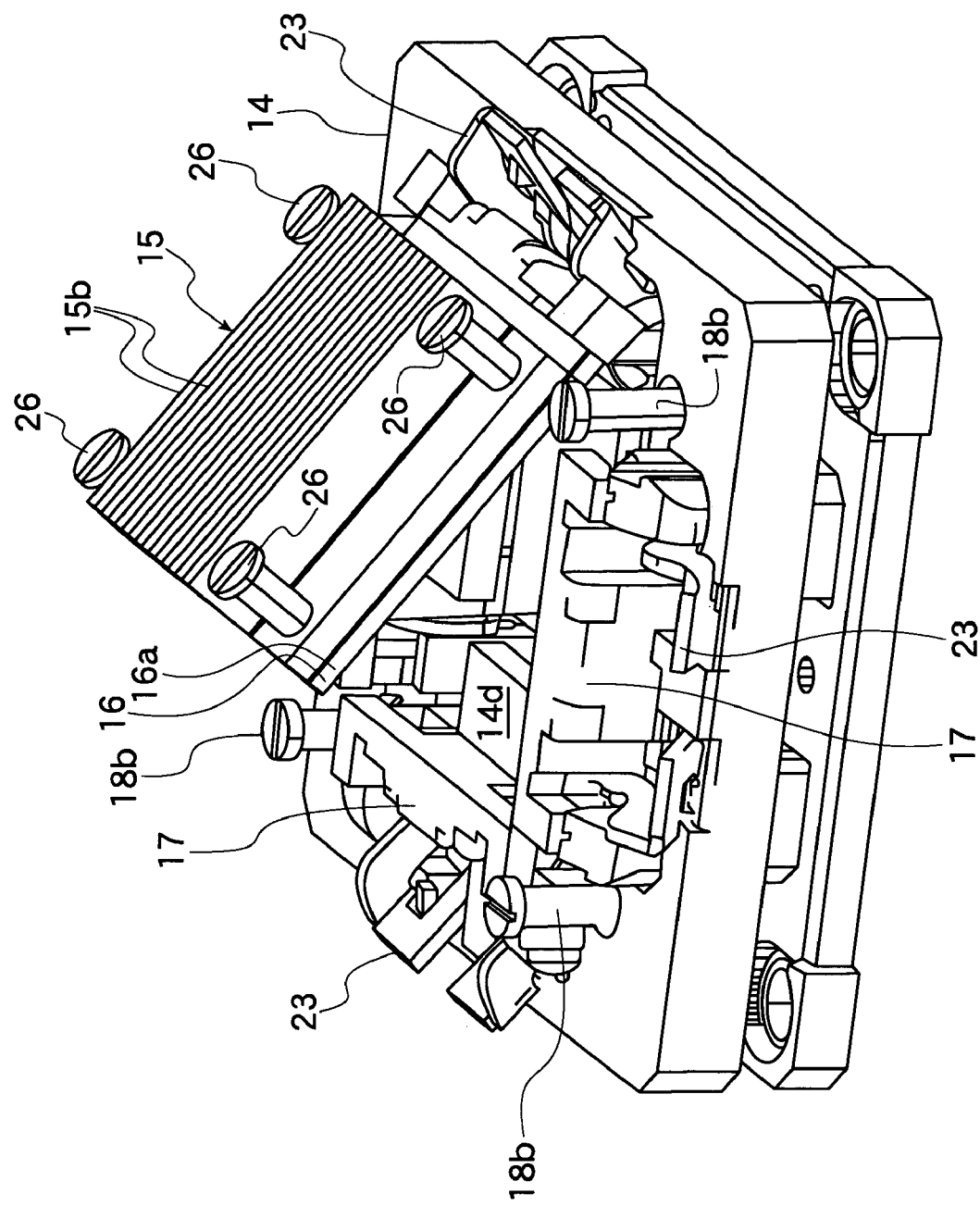
FIG. 5 is a perspective view showing a state during an opening motion of the open/close mechanism of the IC socket of the described embodiment.

The operation member 14 is, as shown in FIGS. 1 and 5, guided to be vertically movable by a guide post 18b of the base member 18 of the socket body 13 and urged upward by the spring 25 as shown in FIGS. 2 and 3.

Figure 16:
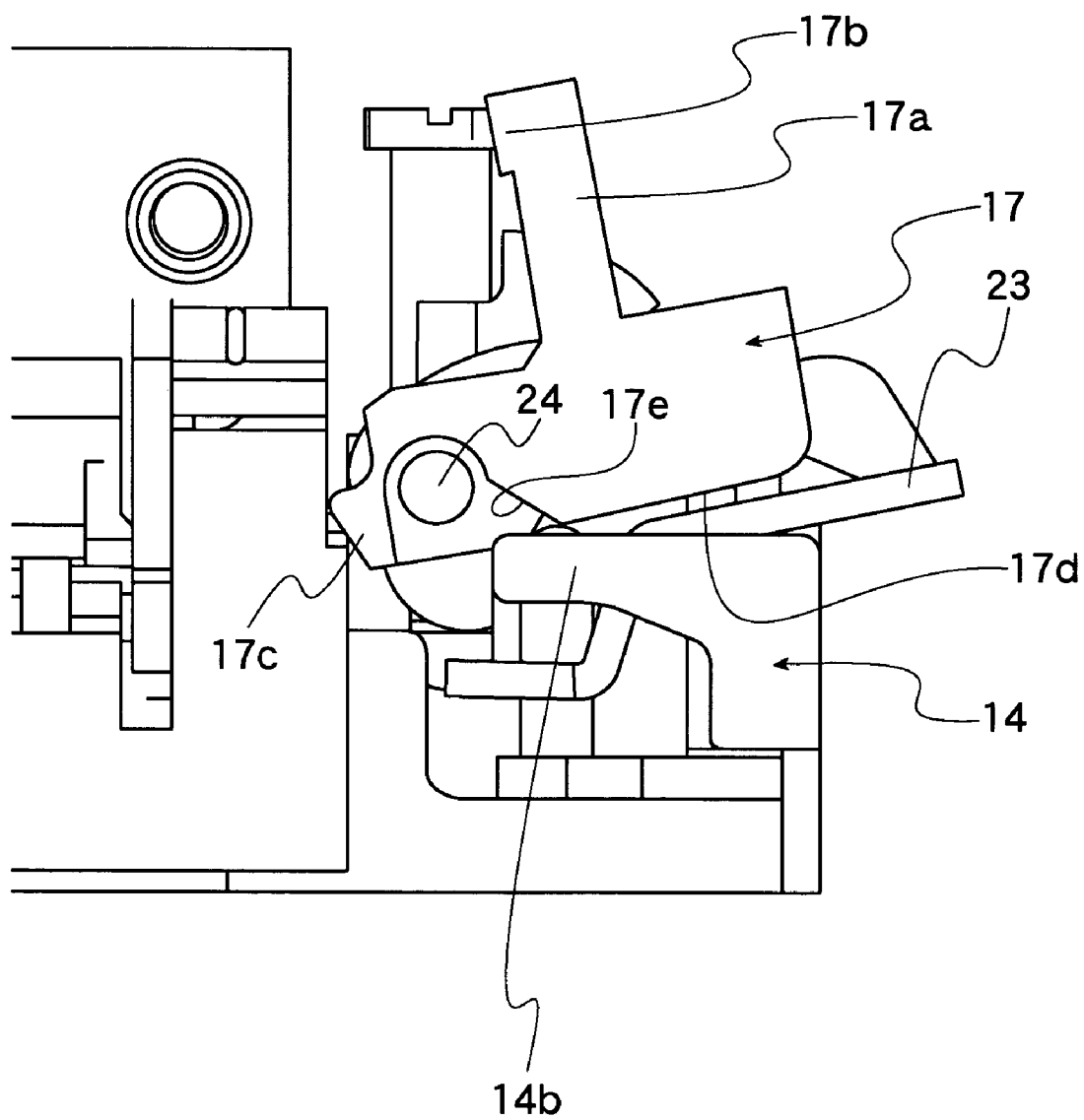
FIG. 16 is a view showing an opened state of the latch member of the embodiment.

Furthermore, as shown in FIGS. 13 and 16, the operation member 14 is provided with an open/close mechanism pressing member 14a for pressing the open/close mechanism 16 and a latch pressing member 14b for pressing the latch member 17 in a manner that when the operation member 14 is moved upward, the open/close mechanism 16 and the latch member 17 are pressed respectively by the open/close mechanism pressing member 14a and the latch pressing member 14b in their closing directions. The details thereof will be described hereinlater.

Figure 7:
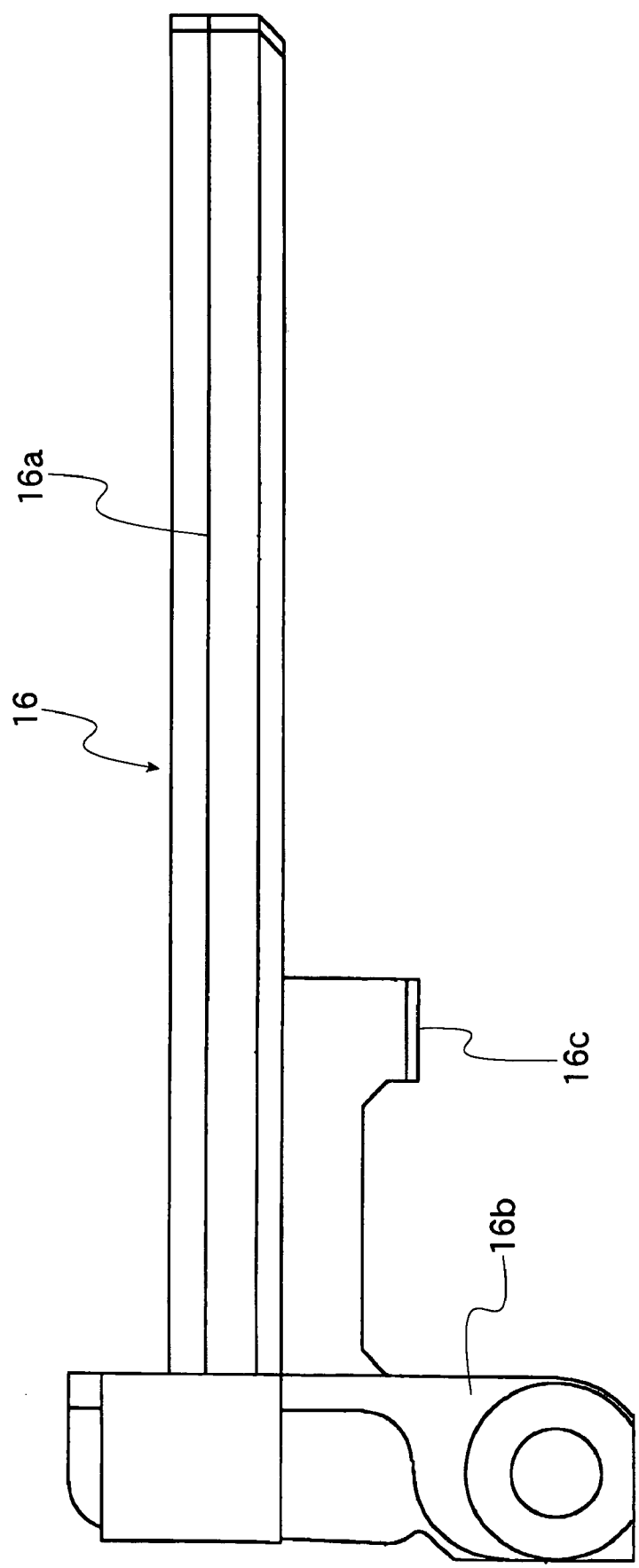
FIG. 7 is a front view showing the open/close mechanism of the IC socket of the embodiment.
Figure 8:
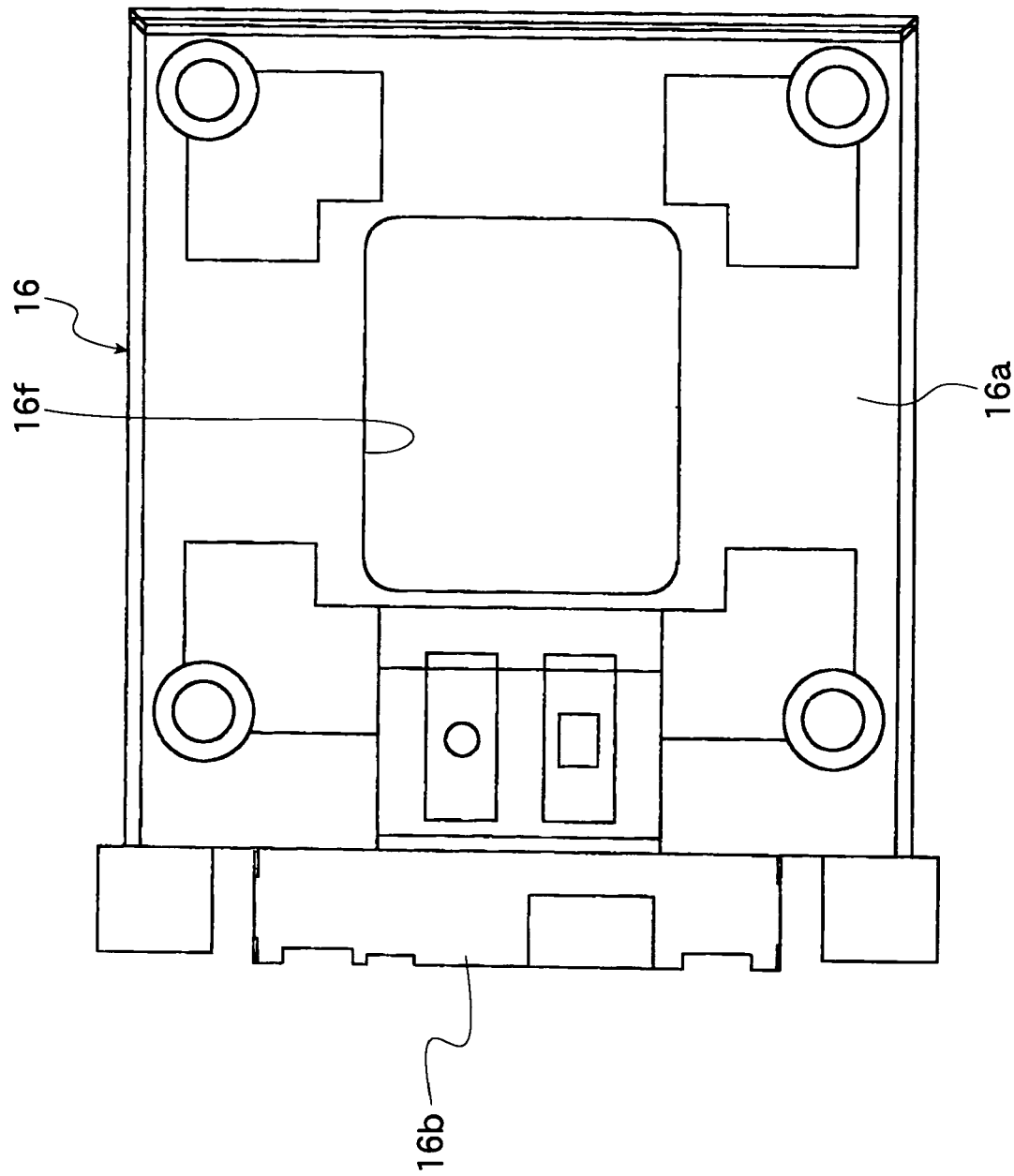
FIG. 8 is a plan view showing the open/close mechanism of the IC socket of the embodiment.

The open/close mechanism 16 is integrally provided with, as shown in FIGS. 2, 7 and 8, a flat plate portion 16a to which the heat sink 15 is mounted, a base end portion 16b supported to a lever member 23 to be pivotal around a rotational shaft 24, and a package pressing portion 16c pressing a peripheral edge of the IC package 12.

Figure 6:
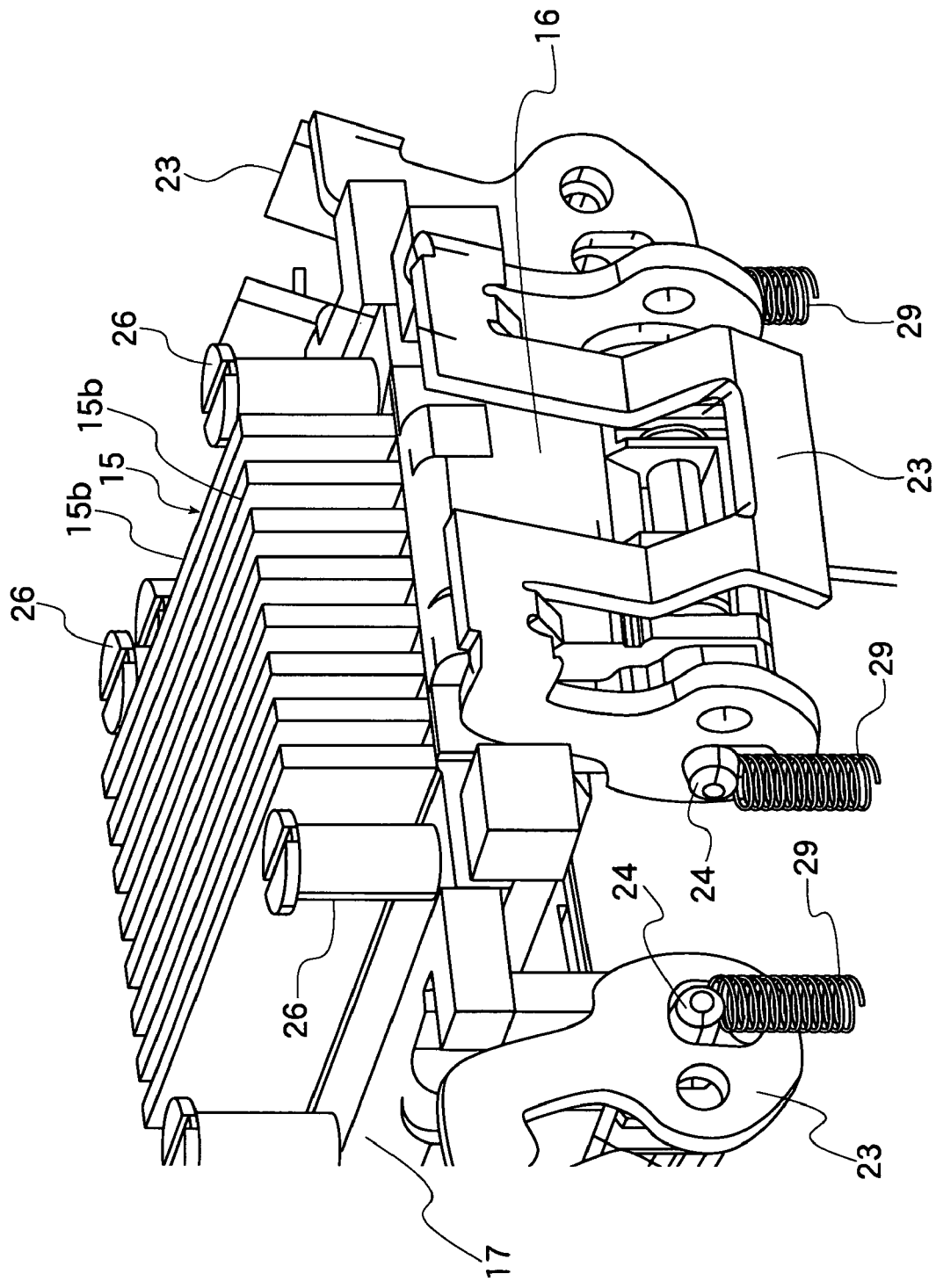
FIG. 6 is a perspective view showing a lever member and associated members of the IC socket of the embodiment.
Figure 14:
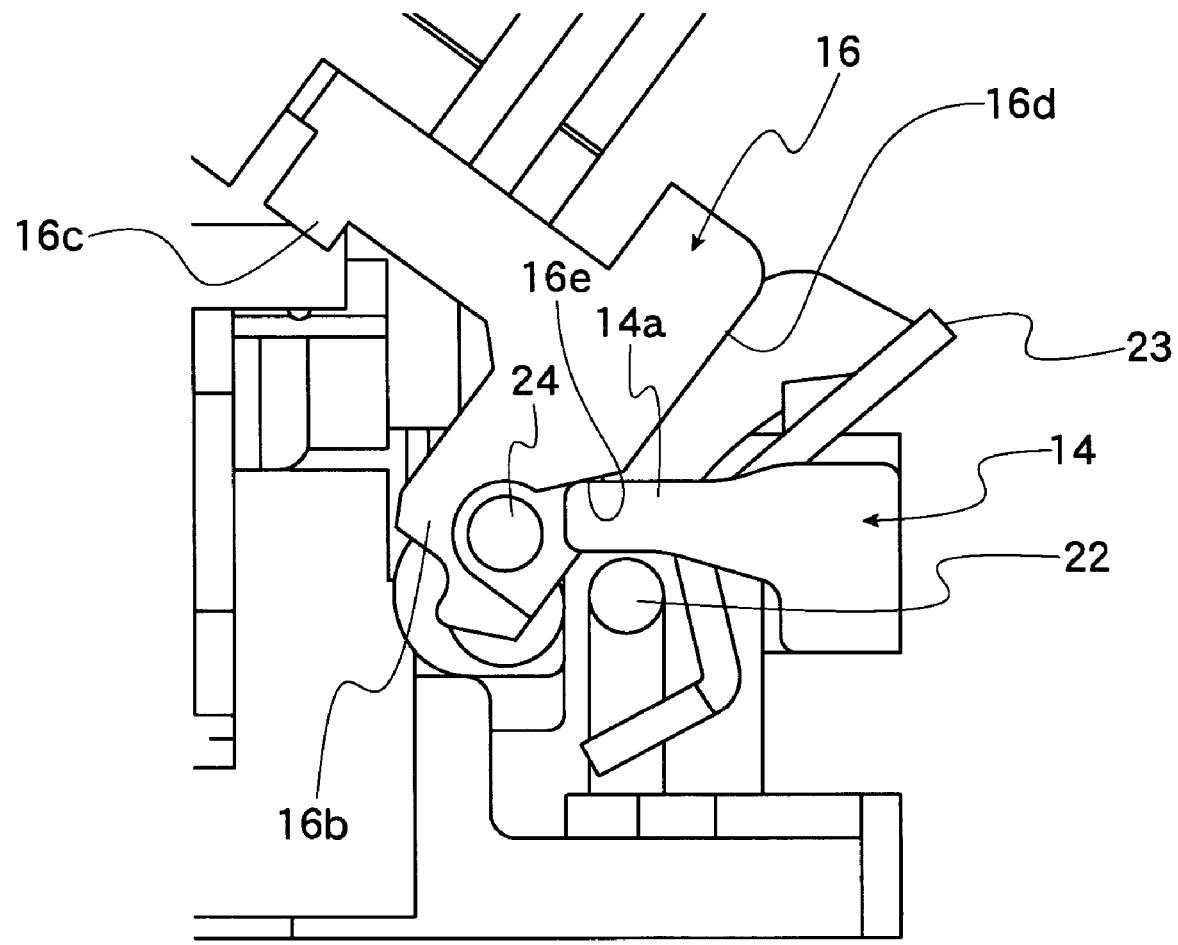
FIG. 14 shows a state during a closing motion of the open/close mechanism of the embodiment.

The lever member 23 is, as shown in FIG. 14, attached to the socket body 13 to be pivotal around a rotational shaft 22, and as shown in FIG. 6, rotated in its opening direction around the shaft 22 when the rotational shaft 24 is urged upward by means of coil spring 29.

Figure 12:
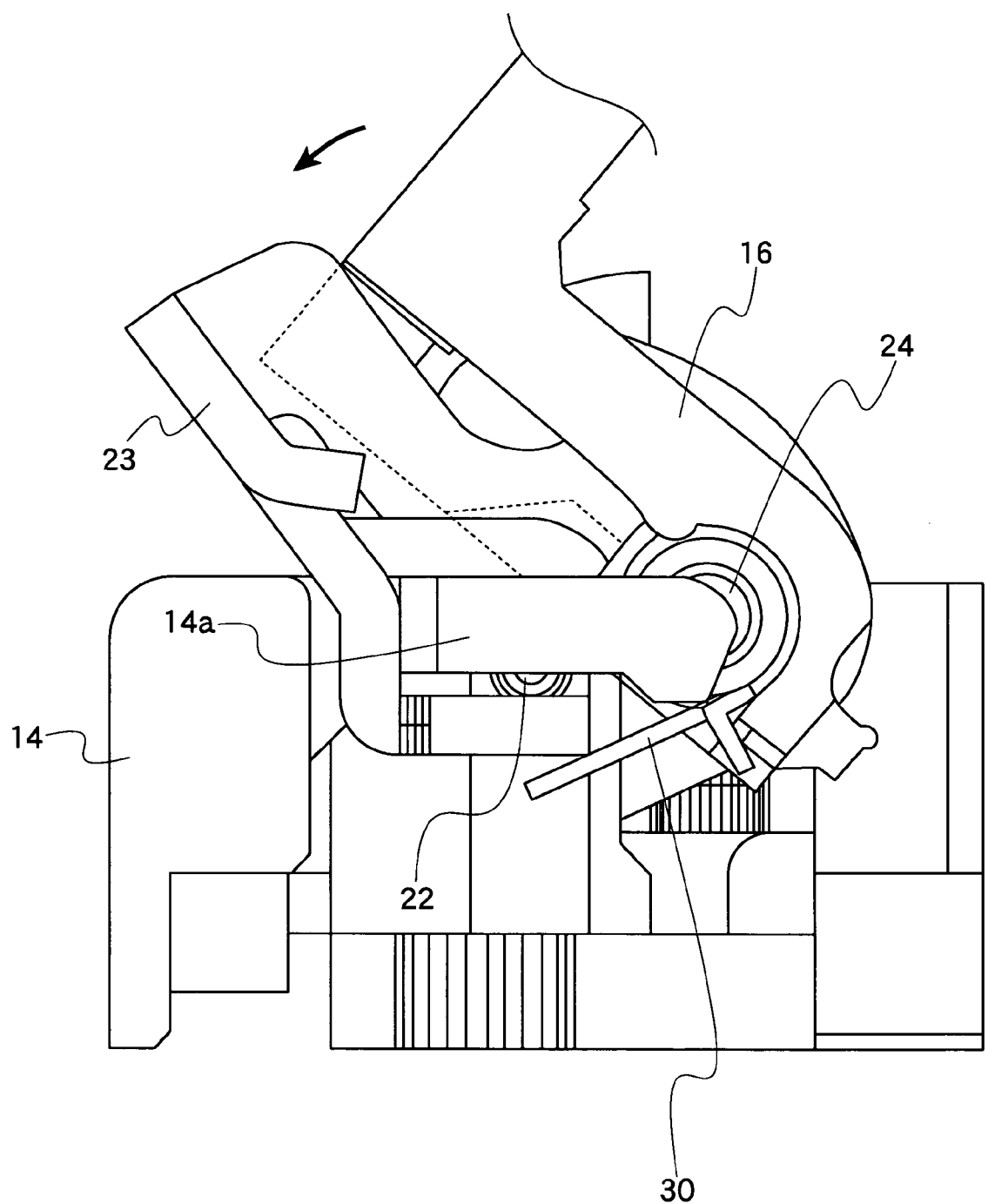
FIG. 12 is a view showing the latch member, lever member and the like of the embodiment.
Figure 15:
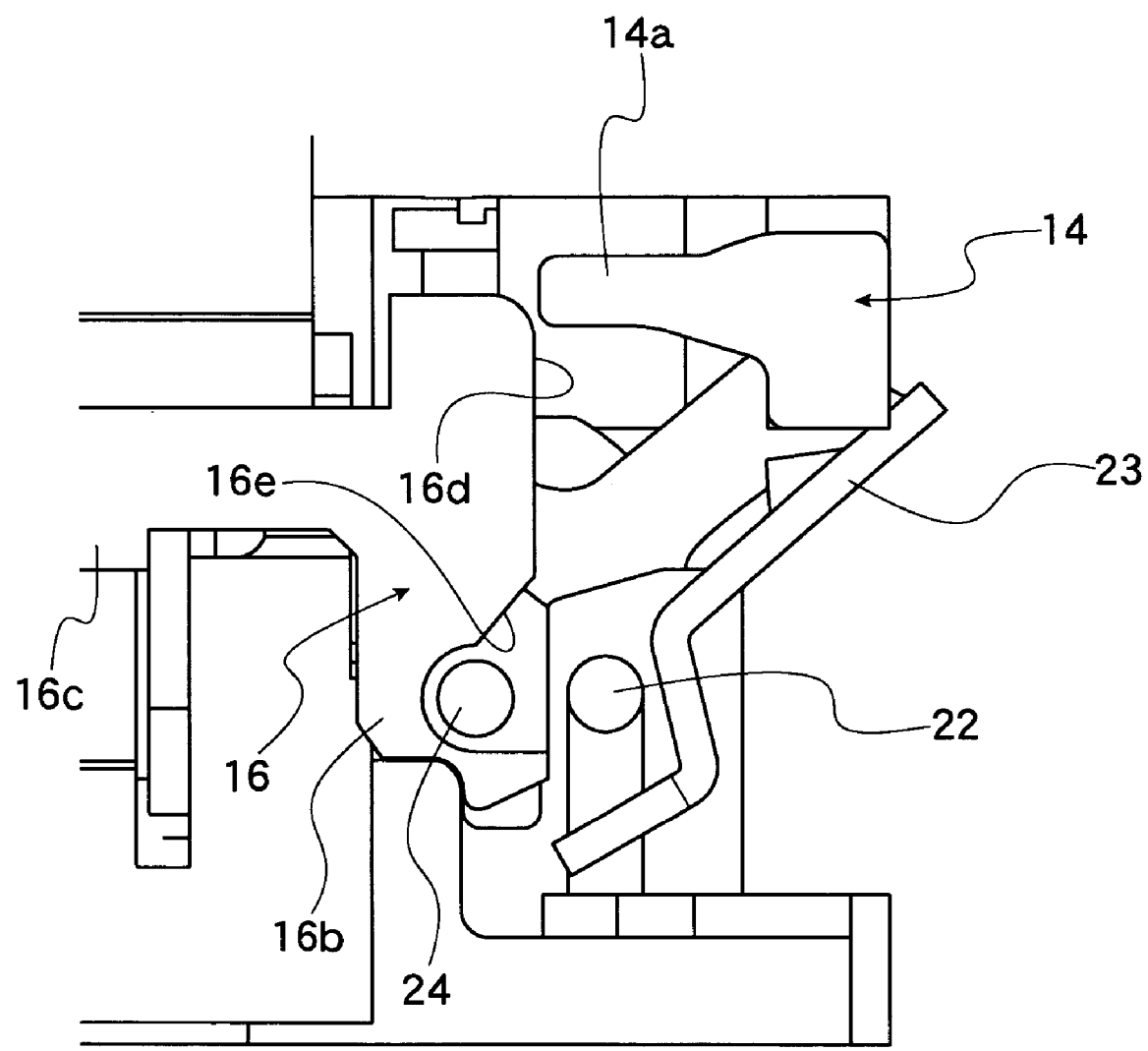
FIG. 15 is a view showing the closed state of the open/close mechanism of the embodiment.

Furthermore, as shown in FIG. 12, the open/close mechanism 16 is urged by a torsion spring 30 in an arrowed direction to approach the lever member 23, and when the operation member 14 is moved upward, a back surface portion 16d of the open/close mechanism 16 is pressed so as to close the same, as shown in FIGS. 14 and 15, by the open/close mechanism pressing member 14a of the operation member 14.

Figure 9:
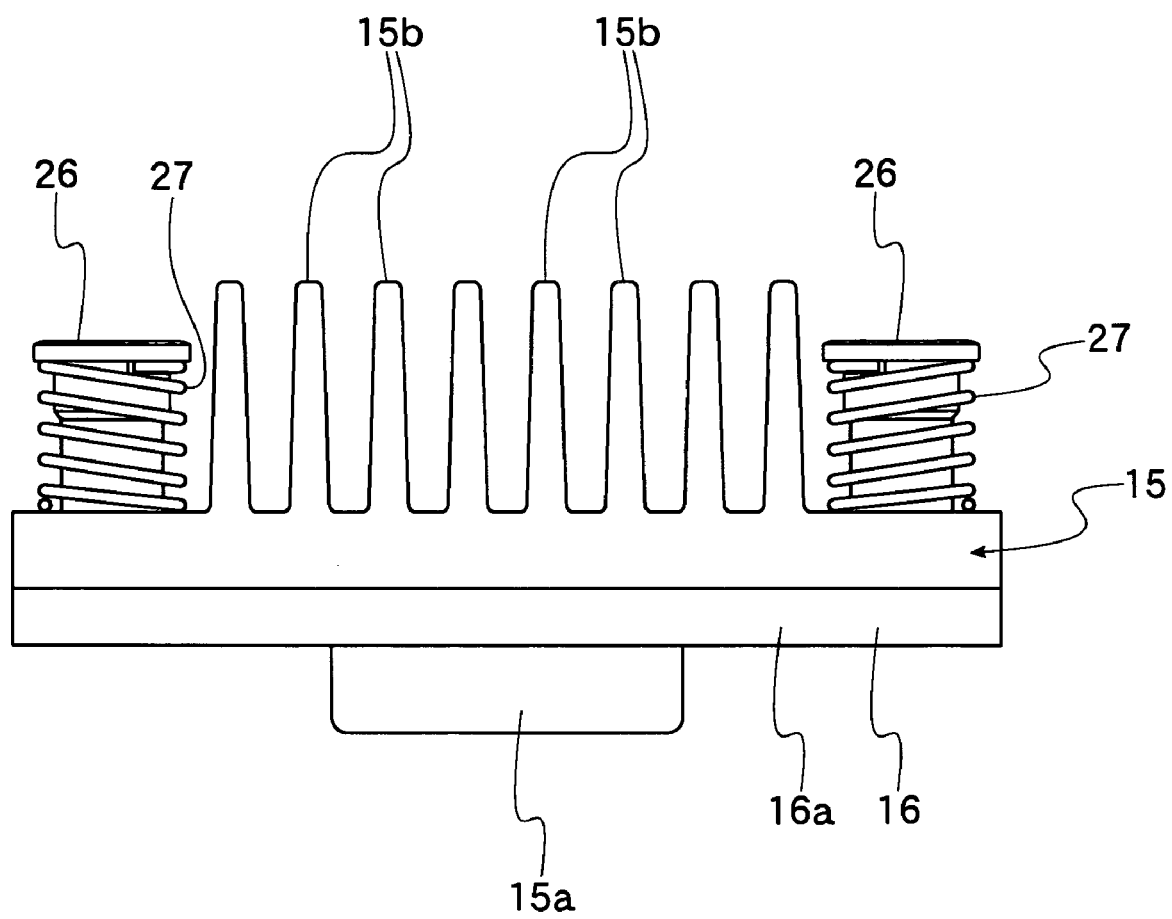
FIG. 9 is a front view showing a heat sink according to the described embodiment.
Figure 10:
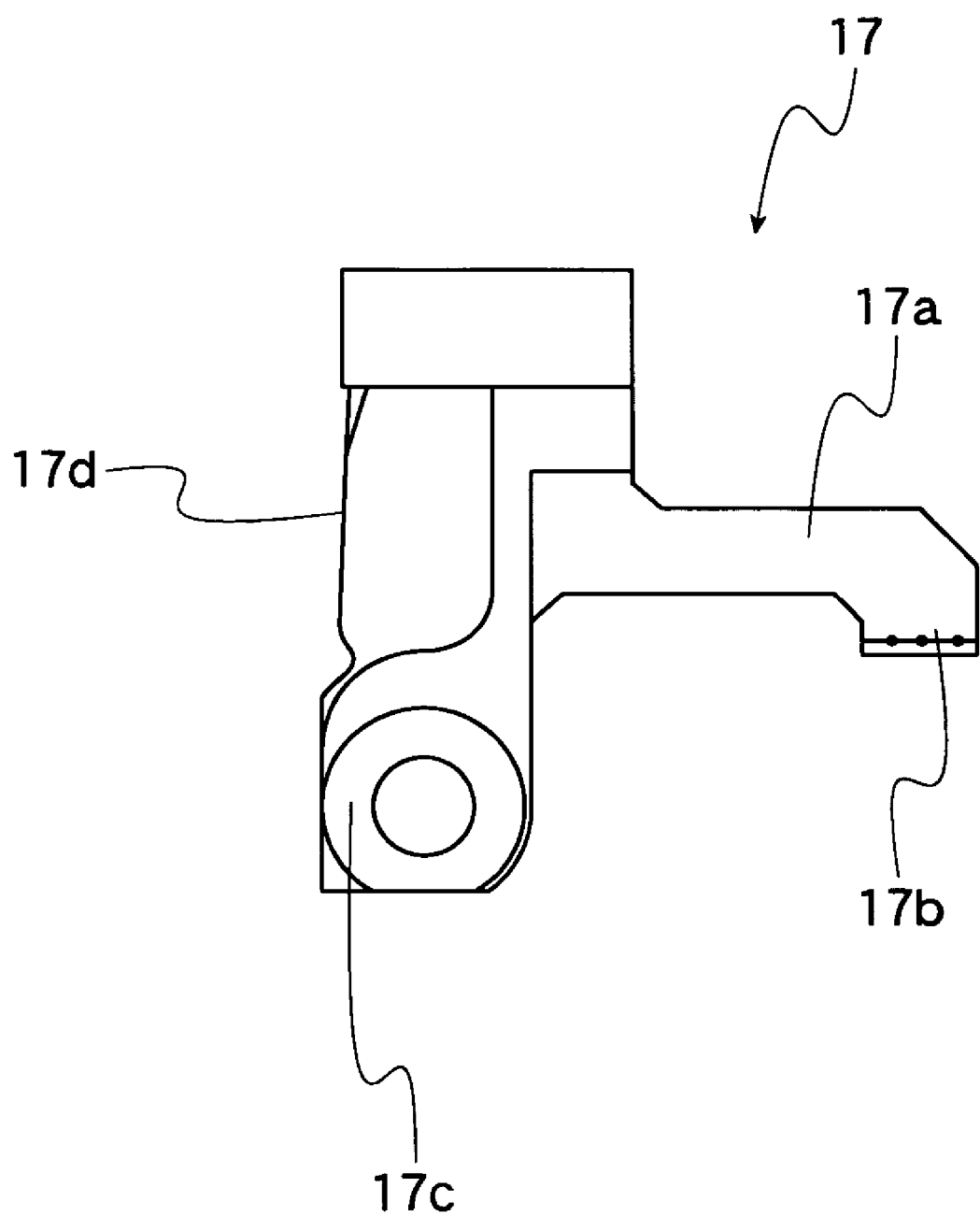
FIG. 10 is a front view showing a latch member according to the described embodiment.
Figure 11:
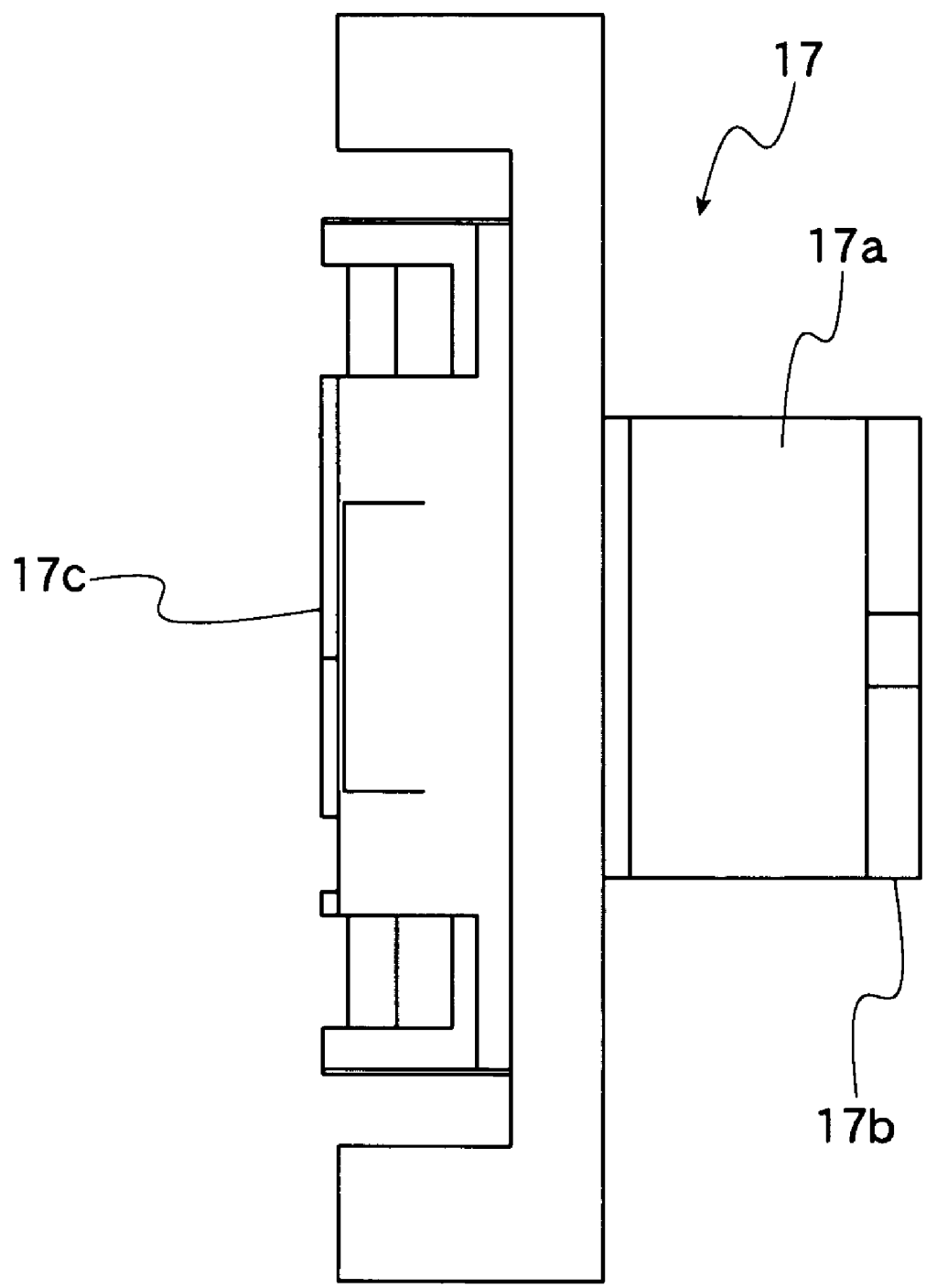
FIG. 11 is a plan view showing the latch member of the embodiment.

As shown in FIGS. 2 and 9, the heat sink 15 is disposed to the flat plate portion 16a of the open/close mechanism 16 by means of a plurality of rivets 26 to be movable in parallel to the perpendicular direction of the flat plate portion 16a and is urged by a spring 27 in a direction to be pressed by the flat plate portion 16a.

The heat sink 15 is formed with a contact projection 15a contacting the IC package 12, and this contact projection 15a extends so as to project downward over the opening 16f, shown in FIG. 8, formed to the flat plate portion 16a of the open/close mechanism 16. The heat sink 15 is also formed with, as shown in FIG. 9, a number of radiation fins 15b to the upper side portion thereof. The heat sink 15 has a size sufficient for covering the entire structure of the IC package 12.

On the other hand, each of the latch members 17 is formed, at a front end portion of an arm 17a, as shown in FIGS. 10, 11 to 16, with a pressing portion 17b for pressing an upper surface of the peripheral edge portion of the IC package 12 and has a base portion 17c formed to the lever member 23 to be pivotal about the rotational shaft 24.

This lever member 23 is mounted to the socket body 13 to be pivotal around the rotational shaft 22, as mentioned before, and the rotational shaft 24 is urged upward by the coil spring 29, whereby the lever member 23 is rotated around the rotational shaft 22 in a direction to be opened.

In addition, the latch member 17 is, as like the open/close mechanism 16, urged by the torsion spring 30 in a predetermined direction, and when the operation member 14 is moved upward, the back surface 17d of the latch member 17 is pressed by the latch pressing member 14b of the operation member 14 in a direction to be closed.

The latch pressing member 14b is arranged to a position higher than the open/close mechanism pressing member 14a, and when the operation member 14 is moved upward, the latch pressing member 14b presses the back surface 17d of the latch member 17 in a timing stage earlier than the pressing of the open/close mechanism pressing member 14a. Accordingly, the opening/closing timing of the open/close mechanism 16 and that of the latch member 17 are set such that the latch member 17 is first closed and the open/close mechanism 16 is thereafter closed.

Figure 17:
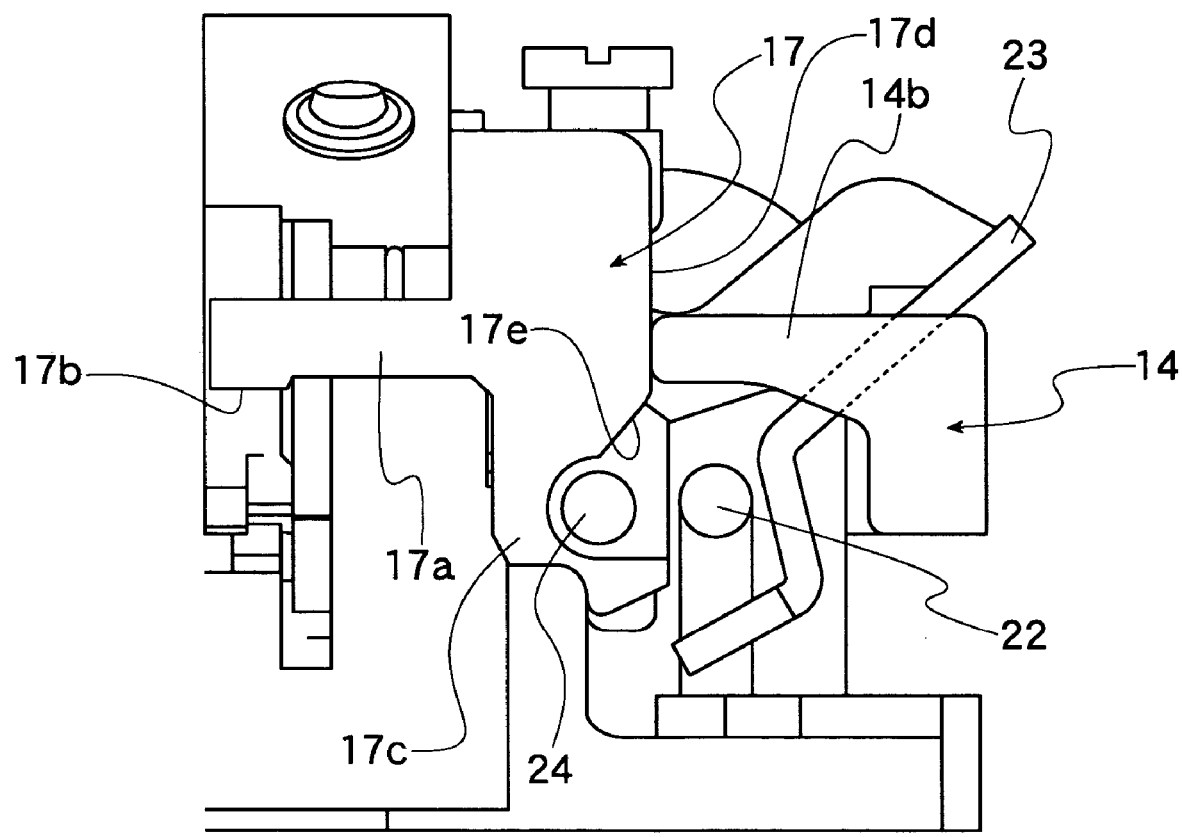
FIG. 17 is a view showing a state during a closing motion of the latch member of the embodiment.
Figure 18:
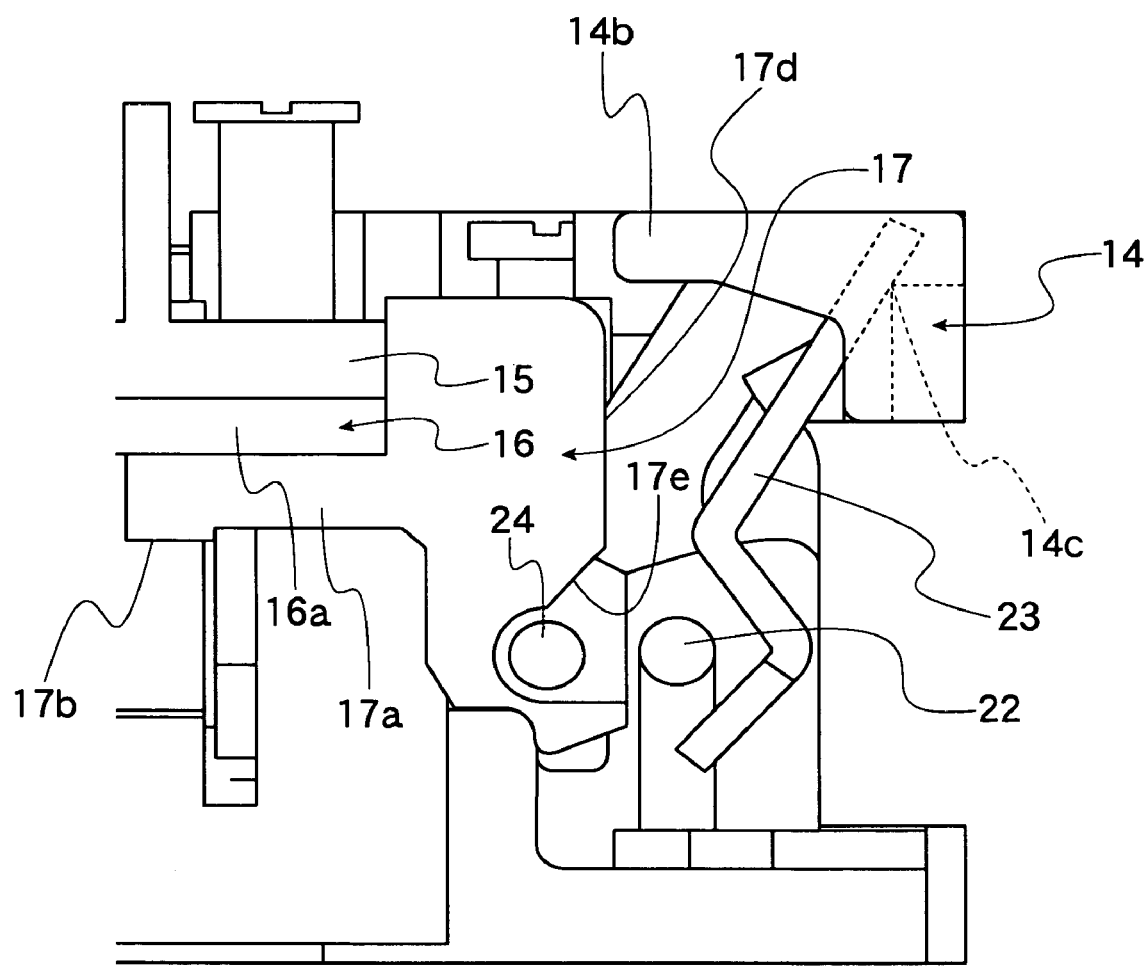
FIG. 18 is a view showing a closed state of the latch member of the embodiment.

Still furthermore, the operation member 14 is provided with, as shown in FIGS. 5, 17 and 18, a cam portion 14c for the lever in the vicinity of the latch pressing member 14b, and the cam portion 14c serves to press the lever member 23 in its closing direction at the time when the operation member 14 is moved upward. According to such motion, as shown in FIG. 18, when the operation member 14 is further moved upward after the pressing of the latch member 17 by the latch pressing portion 14b, the lever member 23 is pressed by the cam portion 14c for the lever so as to be rotated around the rotational shaft 22, and the latch member 17 is moved in parallel in downward direction through the rotational shaft 24, and then, the IC package 12 is further pushed.

The IC socket of the above embodiment will be operated in the following manner.

At first, a plurality of IC sockets 11 are preliminarily arranged on the circuit board, not shown, by inserting the lead portions 21c of the contact pins 21 of the IC sockets 11 throughout the insertion holes of the circuit board and then soldering them thereto.

Thereafter, the IC package 12 is set to such IC socket 11, in the manner mentioned hereunder, by using an automatic machine so as to be electrically connected thereto.

That is, the operation member 14 is depressed downward, with the IC package 12 being held, by the automatic machine and lowered against the urging force of the spring 25. According to this motion, the open/close mechanism pressing member 14a and latch pressing member 14b of the operation member 14 are lowered in their positions, the pressing forces to the open/close mechanism pressing member 14a and the latch pressing member 14b are released, so that the open/close mechanism 16 and the latch member 17 are rotated together with the lever member 23 by the urging force of the spring 29 in their opening directions (see FIGS. 13 and 16).

Under this condition, the IC package 12 is released from the automatic machine and is moved on the accommodation portion 19c of the floating plate 19 of the socket body 13. In such case, the IC package 12 is then guided and positioned to the predetermined position by the guide portions 19a of the floating plate 19, and the terminals 12b of the IC package 12 surely abut against the upper end portions 21a of the contact pins 21, respectively.

Thereafter, the pressing force by the automatic machine to the operation member 14 is released, and the operation member 14 is moved upward, from the state shown in FIGS. 13 and 16, by the urging force of the spring 25. Then, the front end portion of the latch pressing member 14b first abuts against an inclining portion 17e of the latch member 17, slides thereon from the inclining portion 17e to the back surface 17d, thus pressing the latch member 17, and is rotated around the rotational shaft 22 against the urging force of the spring 29 in its closing direction so as to take the standing position of the latch member 17. The peripheral edge portion of the IC package 12 is therefore pressed by the pressing member 17b of the latch member 17 (see FIG. 17).

With reference to FIG. 18 corresponding to FIG. 17, the open/close mechanism pressing member 14a is slidably contacted to the inclining portion 16e of the open/close mechanism 16 and then pressed thereto so that the open/close mechanism 16 is slightly rotated, against the urging force of the spring 29, in its closing direction, but not completely closed.

Thereafter, the operation member 14 is further moved upward, and when moved to its uppermost portion as shown in FIG. 18, the latch pressing member 14b of the operation member 14 is moved to the position apart upward from the latch member 17 and pressed by the cam portion 14c of the operation member 14 in the direction closing the lever member 23.

According to this motion, the lever member 23 is rotated around the rotational shaft 22, and the rotational shaft 24 is then lowered. Therefore, the latch members 17 are lowered vertically and in parallel with their standing attitudes, and the IC package 12 is pushed in from the lower direction, thus ensuring the contacting pressure of the contact pins 21 to the terminals 12b of the IC package 12.

On the other hand, the open/close mechanism pressing member 14a is, as shown in FIGS. 14 and 15, slid from an inclining portion 16e of the open/close mechanism 16 towards the back surface 16d thereof, thereby rotating the open/close mechanism 16 around the rotational shaft 22 in its closing direction. The open/close mechanism 16 is closed at a timing slower than that of the latch member 17, and according to this closing motion of the open/close mechanism 16, the contact projection 15a of the heat sink 15 abuts and contacts to the IC package 12.

In the manner mentioned above, the IC package 12 is accommodated in the IC socket 11 and a burn-in test is for example performed. In such testing time, the temperature of the IC package 12 increases. However, since the contact projection 15a of the heat sink 15 abuts against the IC package 12, the heat of the IC package 12 is transferred through the radiation fins 15b of the heat sink 15, thereby suppressing the increasing of the temperature of the IC package 12.

According to the structures of the IC socket 11 mentioned above, the latch member 17 is first closed and the open/close mechanism 16 is then closed, so that there is less possibility of erroneously carrying out the open/close operations of the latch member 17 and the open/close mechanism 16, thus surely performing the open/close operation.

In addition, since the latch member 17 is first closed and the open/close mechanism 16 is thereafter closed, it is possible for the heat sink 15 to have a size capable of covering the latch member 17, so that the heat sink 15 can be made larger to thereby improve the heat radiation function.

Incidentally, in a conventional structure in which the latch member is closed after the closing of the open/close mechanism, it is difficult for the heat sink to have a size capable of covering the latch member, so that the heat sink is not formed so large as in the present invention.

Furthermore, the heat sink 15 in the present invention is an integral structure, not a dividable one, so that the contact projection 15a can take a large area, thus improving the heat radiation function. That is, for example, if the heat sink is formed to be dividable into two parts at its central portion, a gap will be inevitably caused at its central portion, providing an adverse heat radiation function.

Still furthermore, the open/close mechanism 16 and the latch member 17 are pressed and closed by the open/close mechanism pressing member 14a and the latch pressing member 14b formed to the operation member 14 and, on the other hand, is urged in their opening directions by the spring 29. Therefore, the open/close mechanism 16 and the latch member 17 can be opened or closed with timings shifted from each other with the simple structure using no link mechanism and the like.

Still furthermore, after rotating in its closing direction and pressing the IC package 12, the latch members 17 are moved in parallel in downward direction so as to push the IC package 12 into the IC socket 11, so that the IC socket 11 can be made compact. That is, the latch members 17 can be escaped from the IC package insertion/take-out area by the outward rotating opening motion and can be also moved in parallel in vertical direction, thus ensuring the pushing amount or distance of the IC package 12. On the contrary, in a case when the IC package is escaped from the IC package insertion/take-out area by entirely rotating the latch members to thereby ensure the IC package pushing amount, it is necessary to separate the rotational shaft from the IC package as much as possible, which may result in an enlargement of the IC package in its structure.

Further, although, in the described embodiment, the present invention is applied to the IC socket as "socket for an electrical part", the present invention is not limited to such IC socket and it is of course applicable to other devices.

Furthermore, although in the described embodiment, three latch members 17 and one open/close mechanism 16 are arranged, the present invention is not limited to such embodiment of these numbers, and one open/close mechanism and two latch members may be arranged, or two open/close mechanisms and two latch members may be arranged.

Still furthermore, although in the described embodiment, the heat sink 15 is provided for the open/close mechanism 16, the present invention is not limited to such embodiment, the heat sink may be eliminated with only the open/close mechanism. In such alternation, a portion inside the pressed portion of the latch member is widely and uniformly pressed by the open/close mechanism, so that even in a case of an electrical part to be accommodated in the accommodation portion of the IC socket has an extremely thin thickness, there is no warpage of the latch member by a reaction force from the contact pin at the time of being pressed against the contact pin, and hence, extremely stable pressing condition can be provided.

What is claimed is:

1. A socket for an electrical part comprising:
 a socket body provided with an accommodation portion in which an electrical part is accommodated;
 an open/close mechanism, which is provided to the socket body to be rotatable, for pressing a portion of the electrical part accommodated in the socket body;
 a latch member, which is provided to the socket body to be rotatable around a shaft, for pressing a portion of the electrical part accommodated on the socket body; and
 an operation member, which is provided to the socket body to be vertically movable, for rotating the open/close mechanism and the latch member when the operation member is moved upward, wherein opening and closing timing of the open/close mechanism and the latch member are set such that the latch member is first closed and the open/close member is closed thereafter.

2. The socket according to claim 1, wherein the open/close mechanism is provided with a heat-sink for performing radiation of heat of the electrical part accommodated in the socket body.

3. The socket according to claim 1, wherein the portion of the electrical part pressed by the latch member is a peripheral edge portion of the electrical part.

4. The socket according to claim 1, wherein the portion of the electrical part pressed by the open/close mechanism is a portion inside a pressing portion of the latch member.

5. The socket according to claim 1, wherein the open/close mechanism and the latch member are disposed to be rotatable around rotational shafts.

6. The socket according to claim 5, further comprising:
an urging mechanism urging the open/close mechanism and the latch member in opening directions thereof.

7. The socket according to claim 1, wherein the operation member is formed with an open/close mechanism pressing member for pressing the open/close mechanism and a latch pressing member for pressing the latch member.

8. The socket according to claim 7, wherein when the operation member is moved upward, the open/close mechanism and the latch member are pressed respectively by the open/close mechanism pressing member and the latch pressing member to be thereby rotated in closing directions thereof.

9. The socket according to claim 7, wherein the latch pressing member is arranged to a position higher than the open/close mechanism pressing member.

10. The socket according to claim 1, wherein when the latch member is rotated in a closing direction, the electrical part is pressed thereby and, thereafter, when the latch member is moved in parallel in a downward direction, the electrical part is pushed.

11. The socket for an electrical part according to claim 6, wherein the accommodation portion of the socket body has a rectangular structure and the open/close mechanism is disposed at one side portion of the rectangular structure of the accommodation portion and three latch members are disposed at three side portions of the rectangular structure thereof.

12. A socket for an electrical part comprising a socket body provided with an accommodation portion in which an electrical part is accommodated, an open/close mechanism provided with a heat sink for performing radiation of heat of the electrical part accommodated on the socket body, and a latch member pressing the electrical part accommodated on the socket body, wherein opening and closing timings of the open/close mechanism and the latch member are set such that the latch member is first closed and the open/close mechanism is closed thereafter, wherein the open/close mechanism and the latch member are disposed to be rotatable around rotational shafts and urged by urging means in opening directions thereof, and the socket body is provided with an operation member to be vertically movable, the operation member being formed with an open/close mechanism pressing member for pressing the open/close mechanism and a latch pressing member for pressing the latch member, in which when the operation member is moved upward, the open/close mechanism and the latch member are pressed respectively by the open/close mechanism pressing member and the latch pressing member to be thereby rotated in closing directions thereof.

13. A socket for an electrical part comprising a socket body provided with an accommodation portion in which an electrical part is accommodated, a latch member pressing a peripheral edge portion of the electrical part accommodated on the socket body, and an open/close mechanism pressing a portion of the electrical part inside a pressing portion of the latch member, wherein opening and closing timings of the open/close mechanism and the latch member are set such that the latch member is first closed and the open/close mechanism is closed thereafter, wherein the open/close mechanism and the latch member are disposed to be rotatable around rotational shafts and urged by urging means in opening directions thereof, and the socket body is provided with an operation member to be vertically movable, the operation member being formed with an open/close mechanism pressing member for pressing the open/close mechanism and a latch pressing member for pressing the latch member, in which when the operation member is moved upward, the open/close mechanism and the latch member are pressed respectively by the open/close mechanism pressing member and the latch pressing member to be thereby rotated in closing directions thereof.

* * * * *

UNITED STATES PATENT AND TRADEMARK OFFICE
CERTIFICATE OF CORRECTION

| | |
|---|---|
| PATENT NO. | : 7,097,488 B2 |
| APPLICATION NO. | : 10/986021 |
| DATED | : August 29, 2006 |
| INVENTOR(S) | : Kenji Hayakawa et al. |

Page 1 of 1

It is certified that error appears in the above-identified patent and that said Letters Patent is hereby corrected as shown below:

Claim 11, Column 9, Line 39, change "claim 6," to --claim 1,--.

Signed and Sealed this

Twentieth Day of February, 2007

JON W. DUDAS
*Director of the United States Patent and Trademark Office*